United States Patent [19]

Kamins et al.

[11] Patent Number: 5,633,179

[45] Date of Patent: May 27, 1997

[54] METHOD OF FORMING SILICON/SILICON-GERMANIUM HETEROJUNCTION BIPOLAR TRANSISTOR

[76] Inventors: Theodore I. Kamins, 4132 Thain Way, Palo Alto, Calif. 94306; Albert Wang, 14369 Saddle Mount Dr., Los Altos, Calif. 94022

[21] Appl. No.: 320,815

[22] Filed: Oct. 11, 1994

Related U.S. Application Data

[63] Continuation of Ser. No. 74,186, Jun. 9, 1993, abandoned, which is a continuation-in-part of Ser. No. 809,853, Dec. 18, 1991, abandoned, which is a continuation of Ser. No. 444,586, Dec. 1, 1989, abandoned.

[51] Int. Cl.$^6$ .................................................. H01L 21/265
[52] U.S. Cl. .......................... 438/318; 438/489; 438/320
[58] Field of Search ............ 437/31, 131; 148/DIG. 10, 148/DIG. 72

[56] References Cited

U.S. PATENT DOCUMENTS

| | | | |
|---|---|---|---|
| 5,198,689 | 3/1993 | Fuijoka | 257/197 |
| 5,202,284 | 4/1993 | Kamins et al. | 437/89 |
| 5,250,448 | 10/1993 | Hamasaki et al. | 437/31 |
| 5,296,391 | 3/1994 | Sato et al. | 437/31 |
| 5,346,840 | 9/1994 | Fujioka | 437/31 |
| 5,424,227 | 6/1995 | Dietrich et al. | 437/31 |
| 5,432,104 | 7/1995 | Sato | 437/31 |

OTHER PUBLICATIONS

P. Narozny et al, "Si/SiGe Heterojunction Bipolar . . . By Molecular Beam Epitaxy", IEDM, pp. 562–565. 1988.

Subramanian Iyer et al, "Heterojunction . . . Using Si–Ge Alloys", IEEE Transactions On Electron Devices, vol. 36, No. 10, pp. 2043–2064. Oct. 1989.

*Primary Examiner*—John Niebling
*Assistant Examiner*—Long Pham

[57] ABSTRACT

A heterojunction bipolar transistor. An active region is defined on a silicon collector layer. A silicon-germanium base layer characterized by an integral polycrystalline and epitaxial structure is deposited over the collector such that the epitaxial portion of the base covers substantially the entire active region of the collector. In one version, a field oxide region separates the polycrystalline part of the base layer from the remainder of the collector layer. Alternatively, the collector layer is also characterized by an integral polycrystalline and epitaxial structure; in this version the epitaxial part of the base overlies the epitaxial part of the collector.

12 Claims, 10 Drawing Sheets

METHOD OF FORMING SILICON/SILICON-GERMANIUM HETEROJUNCTION BIPOLAR TRANSISTOR

CROSS-REFERENCE TO RELATED APPLICATIONS

This is a continuation of application Ser. No. 08/074,186 filed on Jun. 6, 1993, abandoned, which is a continuation-in-part of U.S. application Ser. No. 07/809,853, filed Dec. 18, 1991 now abandoned, which in turn is a continuation of Ser. No. 07/444,586, filed Dec. 1, 1989, now abandoned. This case is generally related to U.S. application Ser. No. 07/837,683, filed Feb. 18, 1992 and assigned to the same assignee as the present case, and to U.S. Pat. No. 5,202,284, issued Apr. 13, 1993, and partially assigned to the same assignee as the present case.

BACKGROUND

This invention relates generally to bipolar transistors and in particular to silicon/silicon-germanium heterojunction bipolar transistors.

There has been a continuing need for transistors that can operate at higher and higher frequencies in such applications as high-speed communications and digital data processing. Bipolar silicon transistors, which find many uses in communications and digital electronic circuits, have not adequately met this need. Such a transistor must have a base region that is as thin as possible to obtain the highest possible unity-gain cutoff frequency and that has as little resistance as possible to achieve the highest possible frequency of oscillation. These requirements are at odds with each other because the resistance of the base goes up as its thickness decreases. A related problem is that inter-element capacitances, especially base-to-emitter capacitances, have limited the maximum frequencies of bipolar transistors A heterojunction bipolar transistor ("HBT"), for example a transistor having a junction between a silicon ("Si") emitter and a silicon-germanium ("SiGe") base, is largely free of the inverse relationship between base thickness and base resistance. In an HBT transistor the base doping can be increased without degrading the emitter injection efficiency, thus increasing the maximum frequency and reducing the physical size and the inter-element capacitances of the transistor.

Research respecting Si/SiGe HBTs has been conducted by workers at Stanford University in collaboration with workers at Hewlett-Packard Company, the assignee of this application. This research is described in Gibbons, J. F., et al., "Si/Si$_{1-x}$Ge$_x$ Heterojunction Bipolar Transistors Fabricated by Limited Reaction Processing," *Technical Digest, 1988 International Electron Devices Meeting*, San Francisco, Calif. Dec. 11–14, 1988, pp. 566–569, and in King, C. A., et al., "Si/Si$_{1-x}$Ge$_x$ Heterojunction Bipolar Transistors Produced by Limited Reaction Processing," *IEEE Electron Devices Letters*, February, 1989, Vol. 10, pp. 52–54. The limited reaction processing which is described in these papers provides one method of epitaxial deposition of silicon or silicon-germanium. This method involves a chemical vapor deposition technique in a lamp-heated system; the method permits the wafer to be heated and cooled quickly at the beginning and end of each deposition step.

Background work respecting Si/SiGe HBTs is also described in other publications such as Narozny, P., et al., "Si/SiGe Heterojunction Bipolar Transistor With Graded Gap SiGe Base Made by Molecular Beam Epitaxy", *IEDM*, IEEE, 1988, pp. 562–565. Further efforts at developing improved bipolar transistors are described, for example, in U.S. Pat. No. 4,897,704 issued to Sakurai on Jan. 30, 1990, and in U.S. Pat. No. 5,175,603, issued to Hamasaki on Dec. 29, 1992.

In spite of the advances in the art that are described in the above references, there remains a need for higher-frequency bipolar transistors with lower inter-element capacitances than have been attained.

SUMMARY OF THE INVENTION

The present invention provides a heterojunction bipolar transistor that can operate at higher frequencies than have previously been attained.

Briefly and in general terms, a transistor according to the invention features a silicon collector layer with a defined active region and an overlying silicon-germanium base layer that is characterized by an integral polycrystalline and epitaxial structure. The epitaxial portion of the base covers substantially the entire active region of the collector. A silicon emitter layer is formed on top of the base layer over the active region.

A first embodiment includes a substrate, a subcollector on the substrate, a collector layer on the subcollector, and a field oxide layer over the collector. A window through the field oxide layer defines the active region of the collector. The silicon-germanium layer extends into the window, covering substantially all of the active region of the collector. The polycrystalline portion of the base overlies the field oxide layer around the window.

In another embodiment, the collector layer occupies the window rather than lying beneath it. In this embodiment the base layer covers the collector layer in the window, filling any unused space between the collector and the top of the window.

Another embodiment is similar to the previous one except that it also includes an annular oxide layer that creates a confined region around-the window on top of the field oxide layer. The base layer is confined within this region.

In any of the above embodiments, a layer of material such as nitride or polycrystalline silicon may be used between the field oxide layer and the silicon-germanium base layer. Suitable contact means are provided for establishing electrical contact with the collector and base layers. A dielectric layer may be used over the emitter layer as desired.

In another embodiment, another silicon layer which serves as an extension of the subcollector layer occupies the window. The collector layer overlies both the field oxide layer and the silicon in the window. In this embodiment, the collector layer, like the base layer, has an integral polycrystalline and epitaxial structure, the epitaxial part covering the silicon in the window and the polycrystalline part covering the field oxide.

Other aspects and advantages of the invention will become apparent from the following detailed description, taken in conjunction with the accompanying drawings which illustrate by way of example the principles of the invention.

DESCRIPTION OF THE PREFERRED EMBODIMENTS

Figure 1:
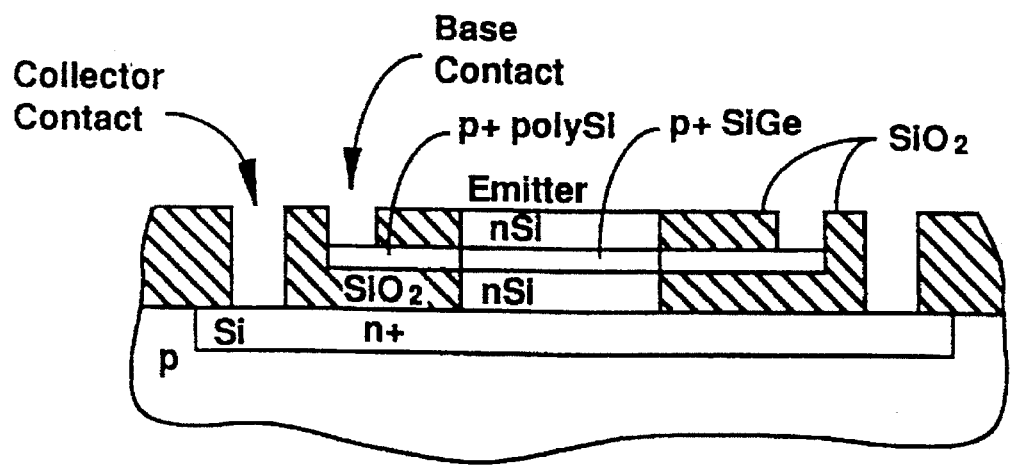
FIG. 1 is a cross-sectional schematic view of a general transistor structure that is representative of various embodiments of a heterojunction bipolar transistor according to the invention.

As shown in the drawings for purposes of illustration, the invention is embodied in a novel heterojunction bipolar transistor ("HBT") in which a silicon-germanium base having an integral polycrystalline and epitaxial structure overlies a silicon collector layer, the epitaxial part of the base covering the active part of the collector. A transistor according to the invention has very low inter-element capacitances and works better and at higher frequencies than other kinds of bipolar transistors.

Several embodiments of the invention will now be described. To simplify the discussion, production of a single transistor on a substrate will be described. In actual practice, many transistors are typically produced on a single substrate. After the transistors have been formed on the substrate, either the transistors are diced to produce a multiplicity of individual transistors or isolation regions are used between the transistors to prevent any harmful interaction between the transistors in actual use. Typically a substrate of $n^+$ material and a subcollector of $n^-$ material are used if individual transistors are to be produced, whereas a p-substrate is usually used with an $n^+$ subcollector if the transistors are intended to remain together on the substrate for interconnection into an integrated circuit.

As used herein the term "selective deposition" refers to a process in which a semiconductor material is only deposited on an exposed portion of silicon, not on any nearby dielectric. In contrast, "mixed deposition" refers to a process in which a semiconductor is deposited both on exposed silicon and on adjacent-dielectric.

The term "integral" refers to the integration of polycrystalline and epitaxial portions of a semiconductor layer into a single structural unit.

A simplified diagram of a transistor that is representative of several of the embodiments disclosed herein is shown in FIG. 1. A silicon-germanium base layer ("p+ SiGe") having an integral polycrystalline and epitaxial structure overlies a silicon collector layer ("nSi"). An emitter (also "nSi") overlies the base. The epitaxial part of the base covers substantially the entire active part of the collector and underlies the emitter. A collector contact opening through surrounding oxide provides for an electrical connection to the collector through an n+ subcollector layer. The subcollector is formed in an upper surface of, or in another embodiment might be deposited on top of, a substrate ("p").

A first embodiment of an HBT according to the invention is shown in FIGS. 2–9, 10a and 10b. At various points in the following discussion, alternative techniques are discussed but not always shown in the figures. The fabrication steps as shown in the figures are preferred but by no means are they the only steps that may be utilized at any particular stage of fabricating an HBT according to the invention.

Figure 2:
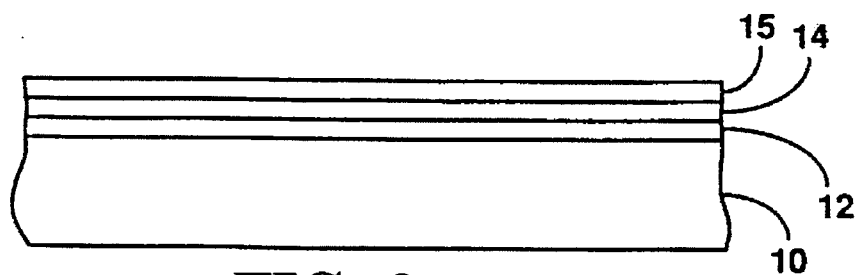
Figure 3:
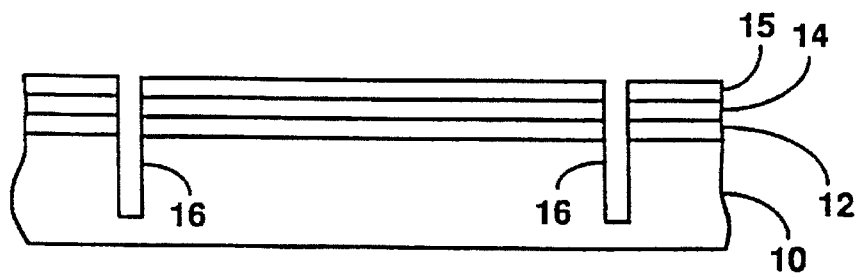

Referring to FIG. 2 there is shown, in a schematic cross-sectional view, a semiconductor substrate 10, typically with a selected (100) crystalline orientation, of a $p^-$ conductivity type silicon. An $n^+$ silicon subcollector layer 12 is formed on the top surface of the substrate 10 and an $n^-$ silicon collector layer 14 is formed on top of the layer 12. The layer 12 can either be grown epitaxially on, or implanted and diffused into, the top surface of the substrate 10. The implant and diffuse technique is probably the technique of choice here; however, epitaxial growth also will produce an acceptable result. The $n^-$ layer 14 is then grown epitaxially on top of the layer 12.

The next step is to etch an isolation trench 16 through the layers 12 and 14 into the $p^-$ substrate 10. This isolation trench 16 is provided to encircle each transistor site on the wafer if there are to be a plurality of transistors on a common substrate. The isolation trench 16 minimizes any interaction between the various transistors through the substrate.

The trench 16 is produced by conventional means, for example by growing or depositing an oxide layer 15 on the layer 14 and then removing it by lithography and etching from the areas where the trench 16 is to be formed. That is followed by etching. By proper control of the etch process, the walls of the trench 16 will be substantially orthogonal to the surface of the substrate 10.

Figure 4:
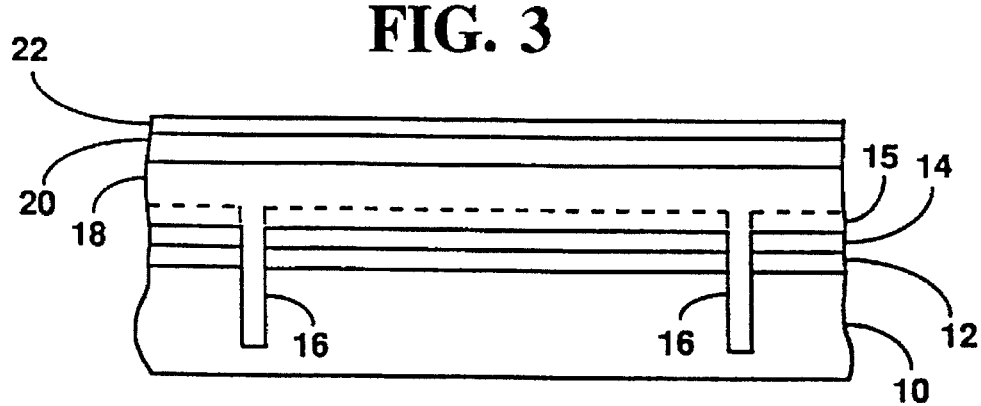

The next portion of the process is depicted in FIG. 4. A thick silicon dioxide ($SiO_2$) layer 18 is deposited, combining with the layer 15 and also filling the trench 16. Alternatively, $SiO_2$ can be formed on the bottom and sides of the trench 16, and then the trench 16 can be filled with polycrystalline silicon. The polycrystalline silicon is then etched from all areas but the trench, and a field oxide layer is regrown over the trench so that an oxide layer covers the entire surface, as the layer 18 is shown as doing.

Figure 5:
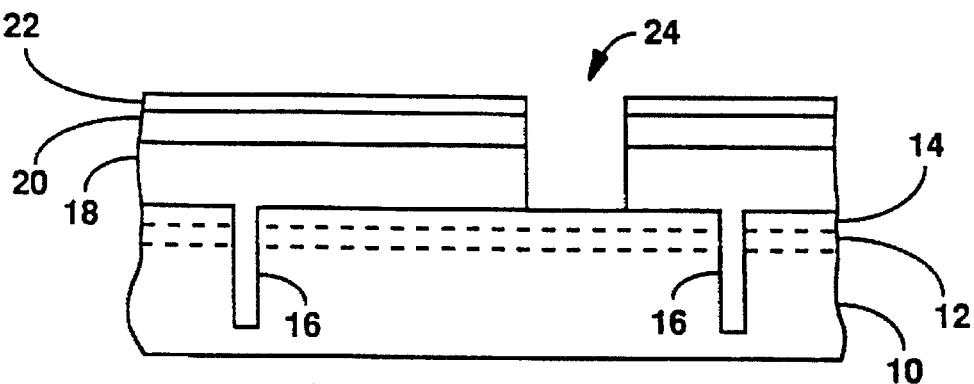
Figure 6:
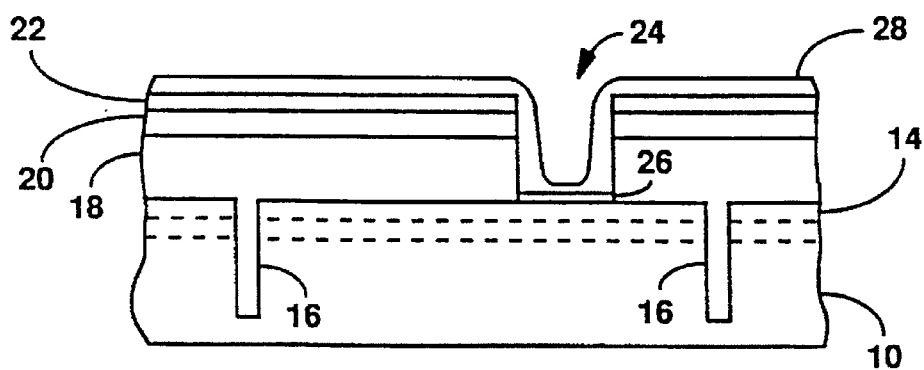

A $p^+$ type polycrystalline silicon layer 20 is then deposited on the oxide layer 18 and a dielectric layer 22, typically of $SiO_2$, is formed over the layer 20. As shown in FIG. 5, a lithography technique is used to etch through layers 18–22 to form a window and thereby expose a portion of the surface of the layer 14 in the area which will become the active region 24 of the transistor when completed.

The process is continued with the formation of a dielectric layer 26, for example a thermal oxide, over the layer 22 and the exposed surface of the layer 14. The layers 26 and 22 combine into a single dielectric layer, identified as 22 in the figures. Then a $p^+$ type polycrystalline silicon layer 28 is deposited over the entire structure including the sides of the window that defines the active region 24.

Figure 7:
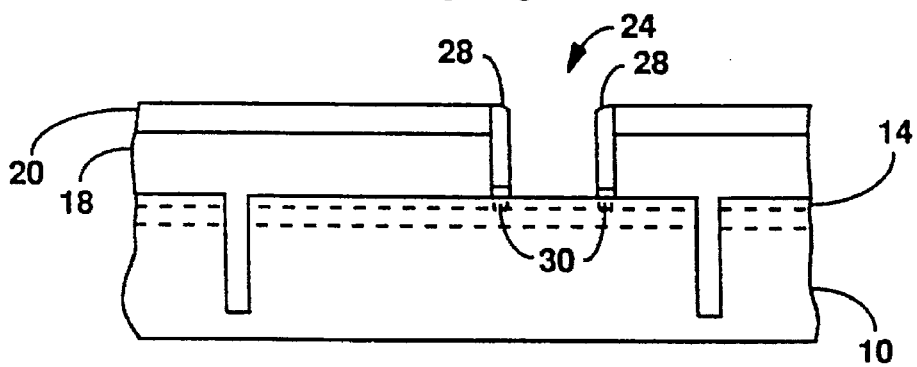

Next in FIG. 7, the polysilicon layer 28 is anisotropically etched from the horizontal surfaces of layers 22 and 26. The dielectric layers 22 and 26 act as etch stops in this step. This results in vertical polycrystalline side-walls in the window. The remaining portions of the dielectric layers 22 and 26 are then removed by etching.

In some versions of this process, the dielectric layer 26 and possibly also the layer 22 may be omitted. If the layer 26 is omitted, boron may be diffused from the layer 28 on the sidewalls of the window into the intersection of the layer 28 and the layer 14, causing the $p^+$ material to extend below the top of the $n^-$ layer 14. This can potentially reduce series resistance in the base and also lower junction leakage. In a further simplification, the layers 22 and 28 can be omitted so that no polysilicon is formed on the sidewalls of the window.

Figure 8:
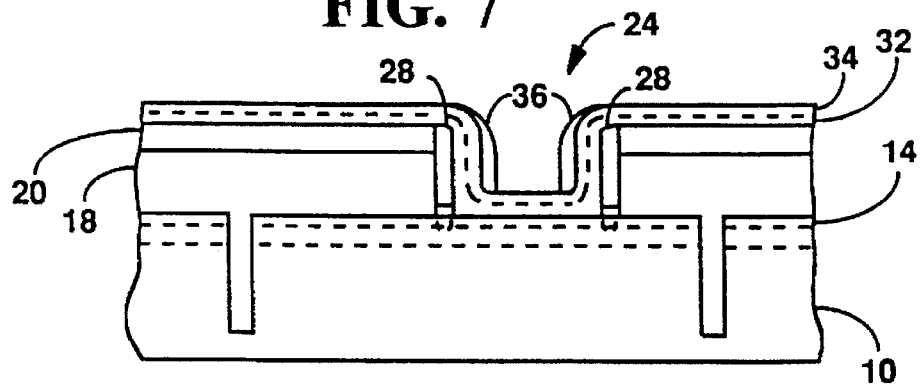

Next, as shown in FIG. 8, is the mixed deposition of a $p^+$ silicon-germanium base layer 32 over the layers 20 and 28 and the exposed part of the layer 14 in the window. That is followed by the mixed deposition of an $n^-$ silicon emitter layer 34 on layer 32. The deposition of both of layers 32 and 34 is preferably performed by chemical vapor deposition; however, other techniques such as molecular beam epitaxy may also be used if desired.

From this point in the process there are many different techniques that may be used to finish the transistor. The order in which those steps are performed is not critical. In following the steps depicted in the figures, the next step is the optional formation of silicon dioxide spacers 36 on the sidewalls of the window. Regions outside the window and spacers may be doped $p^+$ type by boron implantation.

Figure 9:
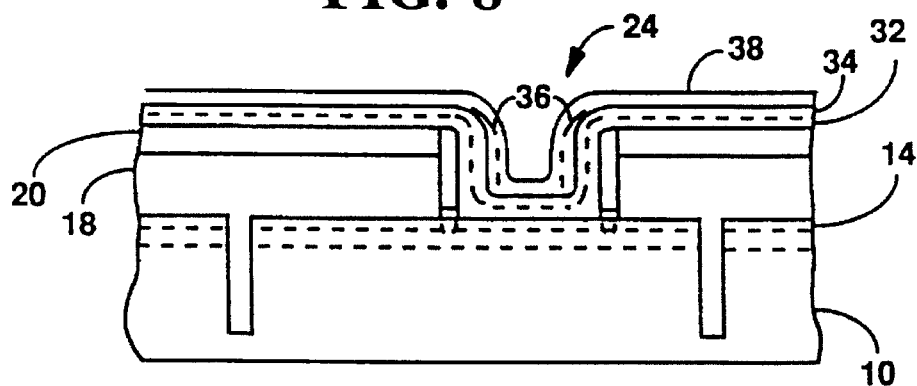

In FIG. 9 an $SiO_2$ layer 38 is shown having been formed over the entire surface of the structure including the bottom and sidewalls of the window.

Figure 10A:
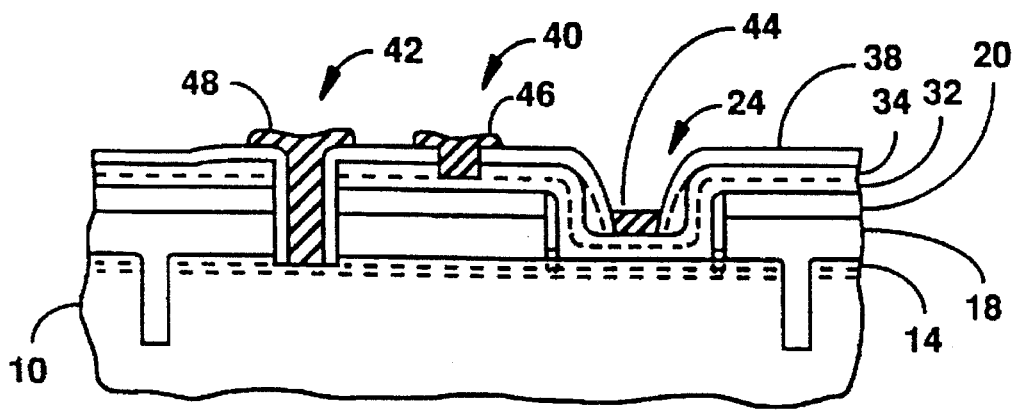
FIGS. 2–9 and 10a–10b are cross-sectional views illustrating the steps of producing a heterojunction bipolar transistor according to a first embodiment of the invention.

FIG. 10a shows the oxide layer 38 has been opened in the active region 24 for insertion of an emitter contact. The layer 38 has also been opened to define a base contact region 40 and a collector contact region 42, typically by a combination of lithography and etching. The layer 34, which serves as the emitter, may be doped $n^+$ at least near its surface. The emitter, base and collector contact regions are each metallized to create electrical contacts 44, 46 and 48, respectively.

Figure 10B:
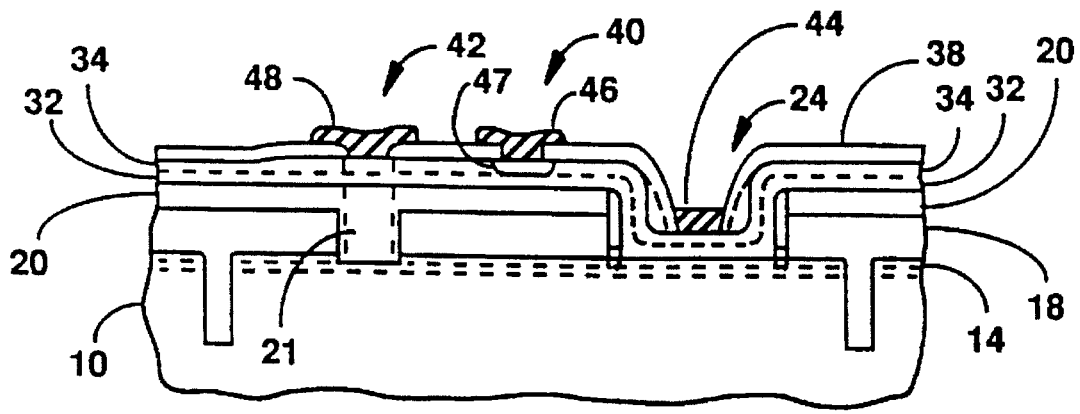

FIG. 10b shows an alternative method of making electrical contact with the base and collector regions. With respect to the base contact, instead of etching down to the layer 32 through the window that defines the location of the base contact in the region 40, boron can be implanted to layer 34 through the base contact window. This then creates a localized p type region 47 that extends through the emitter layer 34 to the base layer 32. The base contact 46 is then formed by metallizing.

Similarly, the collector connection can be established other than by etching through all of the layers to the sub-collector layer 12. For example, a well 21 could have been opened through the dielectric layer 18 so that the layer 20 also filled the well 21. After dielectric layer 22 was developed on the 20, a window could have been opened above the well 21 and the polycrystalline silicon that extends down to the sub-collector layer 12 could have been doped with arsenic or phosphorus to create a localized n type region. Then following the addition of layers 32 and 34, just prior to the metallization step, arsenic or phosphorus could again be used to dope layer 32 n type through n type layer 34. Thus, the collector metallization can simply be made to layer 34 since an n type path through the structure to the sub-collector layer 12 was developed as the device was produced.

An advantage of the first embodiment is that no significant heat treatment is needed after forming the SiGe layer 32 because only non-selective silicon deposition is performed after that step. In addition, the base-collector junction near the sidewalls of the device may extend below the SiGe layer to reduce sidewall leakage.

Another embodiment of the present invention is a transistor produced by the steps depicted in FIGS. 11–14.

Figure 11:
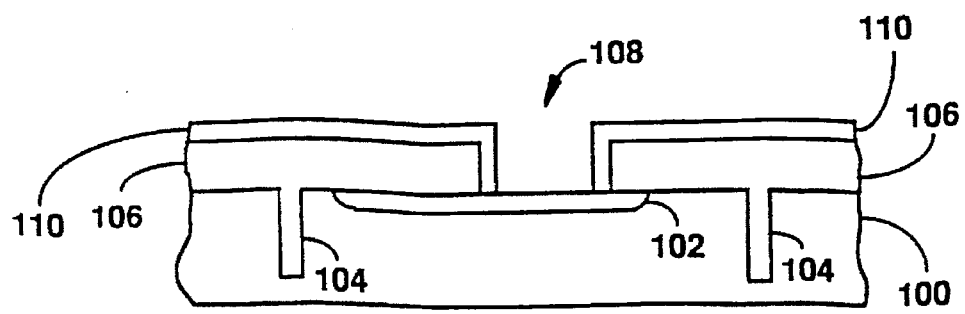
FIGS. 11–14 are cross-sectional views illustrating the steps of producing a heterojunction bipolar transistor according to another embodiment of the invention.
Figure 12:
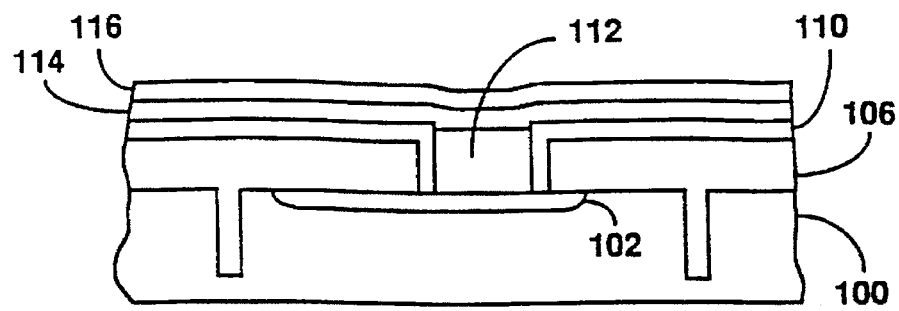

Referring to FIG. 11, there is shown, in a schematic cross-sectional view, a semiconductor substrate 100 with a selected (100) crystalline orientation of a $p^-$ conductivity type Si. The surface of substrate 100 is initially prepared by adding a sub-collector $n^+$ region 102 in the top surface.

Region 102 is implanted and diffused into a portion of the top surface of substrate 100, or it could be formed epitaxially, as discussed in connection with FIG. 2. Isolation trenches 104 are also formed to define the transistor regions on substrate 100 in the same manner as discussed above in the development of a transistor of the first embodiment. Next a field oxide layer 106 is grown over the top surface of substrate 100, including region 102.

Next, an active region well 108 is opened above one end of the sub-collector region 102 by means of lithography and etching techniques that are well known in the art. That may be followed by the formation of a nitride $Si_3N_4$ layer 110 on the surface of the oxide layer 106, including the side walls of well 108. To maintain the cleanliness of the critical surface between each of the next three steps, those three steps can be performed in one reactor cycle.

First an $n^-$ type Si layer 112 is selectively, epitaxially grown in well 108. Layer 112 will become the collector layer. The thickness of layer 112 is typically less than or equal to the thickness of oxide layer 106. Second a $p^+$ type SiGe layer 114 is deposited non-selectively in mixed form over the entire surface of substrate 100. The portion of layer 114 that is substantially above layer 112 will grow epitaxially and thus have a single crystalline structure, and the portion of layer 114 above the oxide or nitride layer will have a polycrystalline structure. Layer 114, also, will become the base layer. Third, an $n^-$ type Si layer 116 is nonselectively deposited in mixed form on the SiGe layer 114, and this layer will become the emitter layer. Similar to layer 114, layer 116 grows epitaxially with a single crystalline structure above the single crystalline portion of layer 114, and the remainder of layer 116 has a polycrystalline structure.

Figure 13:
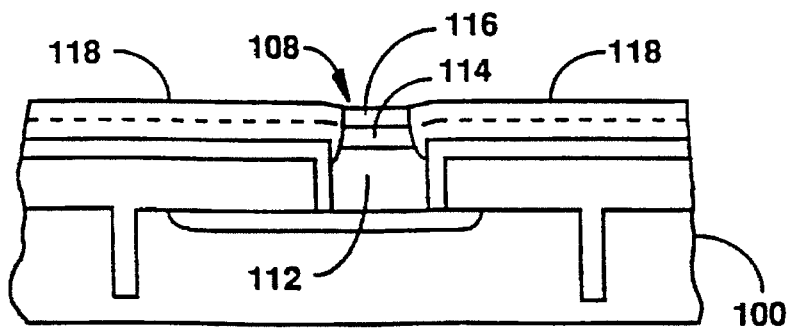

Next, as shown in FIG. 13, the polycrystalline portions and a small portion of the epitaxial portions near the polycrystalline portions of layers 114 and 116 are counter doped with boron to become $p^+$ type material, or more heavily $p^+$ type, indicated as layer 118. Following this step both layer 114 and 118 are each $p^+$ type material, thus layer 118 becomes a reasonably low resistance base contact layer of the transistor. This structure limits the thickness of the base layer 118 to the combined thickness of layers 114 and 116.

Figure 14:
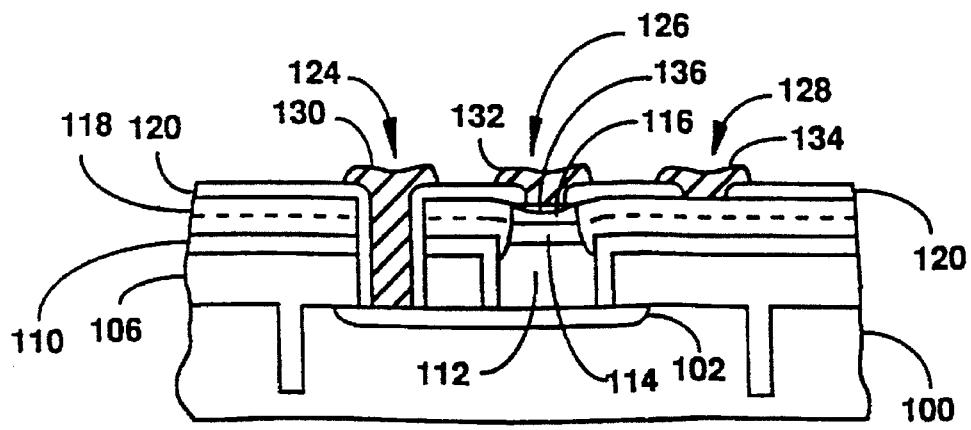

The remainder of the process is to complete the electrical connections to the collector, base and emitter layers. This may be accomplished by traditional techniques and in various orders of steps. FIG. 14 illustrates one of the possible final forms that result from one of the step sequences that amy be used to accomplish this.

First a dielectric layer 120 is formed over layers 116 and 118. A window is then opened to establish the collector contact at 124. The well for this contact may be etched through layers 120, 118, 110 and 106 to allow electrical connection to sub-collector region 102 and thereby to collector layer 112. Alternatively, a contact may be made to an n-type region previously formed extending from the surface to the $n^+$ region 102 in the conventional manner. If the first technique is used, a dielectric is then formed on the sidewalls of well 124. Next, windows are opened in dielectric layer 120 through which the emitter and base contacts will be established at points 126 and 128, respectively. An $n^+$ implant 136 is made to emitter layer 116, typically using arsenic.

The final step is the metallization of the component to form the collector, emitter and base contacts 130, 132, and 134, respectively. Alternatively a process similar to that discussed in relation to FIG. 10b of the first embodiment could be used.

Figure 15:
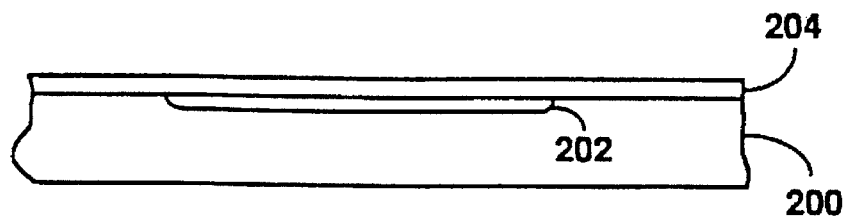
FIGS. 15–18 are cross-sectional views illustrating the steps of producing a heterojunction bipolar transistor according to another embodiment of the invention.

Another embodiment of the present invention is presented in FIGS. 15–18. FIG. 15 shows a schematic cross-sectional view of a semiconductor substrate 200 with a selected (100) crystalline orientation of a p⁻ conductivity type Si. The surface of substrate 200 is initially prepared by implanting a sub-controller n⁺ region 202 into the top surface. This could alternatively by done by epitaxial deposition as described with respect to FIG. 2. An n⁻ Si layer 204 is then grown epitaxially on the surface of substrate 200.

Figure 16:
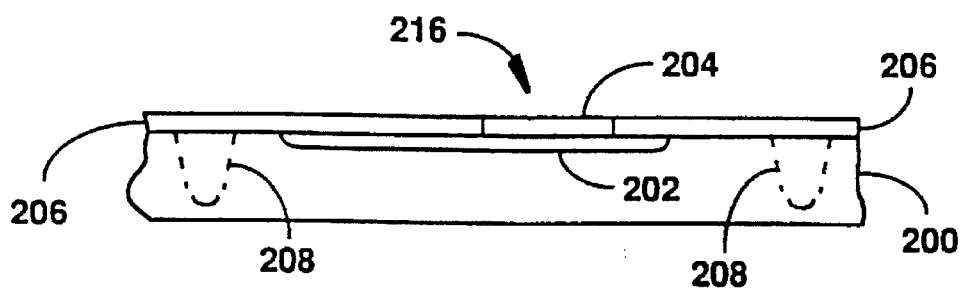

Referring next to FIG. 16, isolation regions 208 are formed by either diffusion or the etching of trenches by any of several well known techniques. A field oxide layer 206 is grown outside the active device region 216 by a known technique. (e.g., LOCOS or SWAMI).

Figure 17:
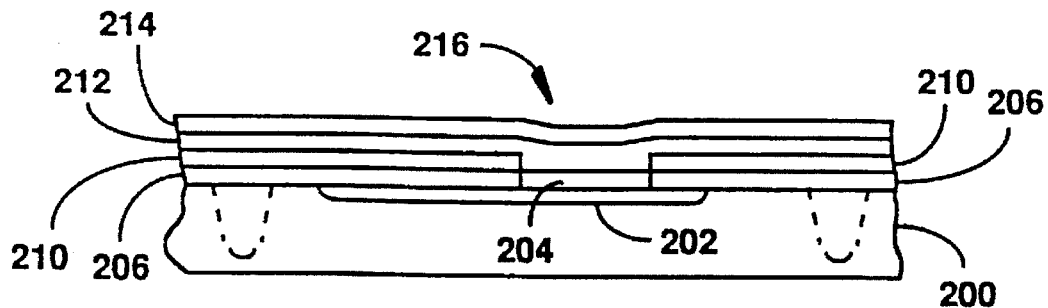

As shown in FIG. 17, a Si or nitride layer 210 is grown over the surface of substrate 200 and then removed from layer 206 in the active region of the transistor. If Si is grown over the oxide layer 206 it is polycrystalline in structure and can be doped p⁺ type. That is followed by the non-selective deposition of SiGe 212 over the surface of substrate 200, resulting in the crystalline structure being polycrystalline over layer 210 and single crystalline over layer 204. An n⁻ Si layer 214 is next deposited over the SiGe layer 212 with layer 214 assuming the crystalline structure of the portion of layer 212 on which it was grown.

Figure 18:
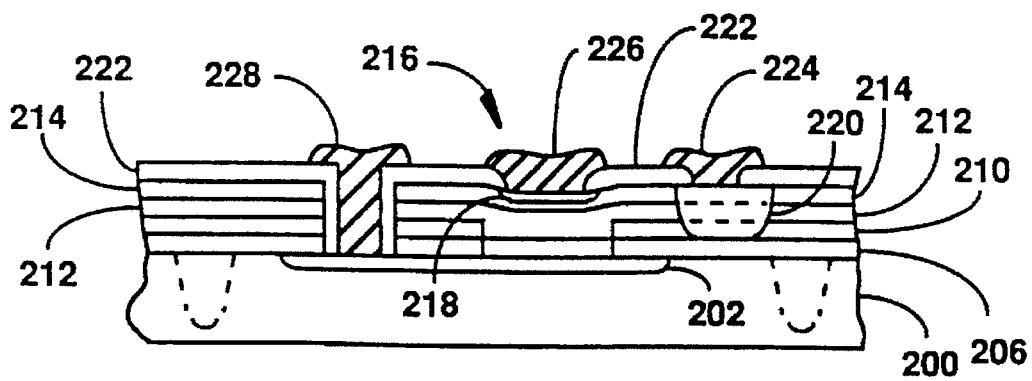

FIG. 18 then shows the finalization of the transistor of this embodiment which is nearly identical to that illustrated in FIG. 14. Layer 214 can be doped p⁺ outside the active device region 216. An oxide layer 222 is formed on the surface of substrate 200 and windows opened where the base, emitter and collector contacts are to be located. Layer 214 is doped n⁺ through the window in the active region 216 to form layer 218, the base contact region is doped p⁺ to form base contact 220, and the collector contact 228 is formed through all of the layers to the sub-collector region 202. Finally, base, emitter and collector terminals 224, 226 and 228, respectively, are metallized in the appropriate locations. Alternatively, the collector and base contact regions can be developed as discussed previously.

The advantage of this structure is that selective deposition of Si is not required, thus minimizing the sidewall defects that can result from the selective deposition of Si. Another advantage that results if layer 210 is a polycrystalline Si layer above the field oxide layer 206 is the ability to choose the thickness of the base contact relatively independently to optimize the base resistance.

Another embodiment that allows further flexibility in the design of the thickness of the polycrystalline base is described with respect to FIGS. 19, 20, 21a and 21b.

Figure 19:
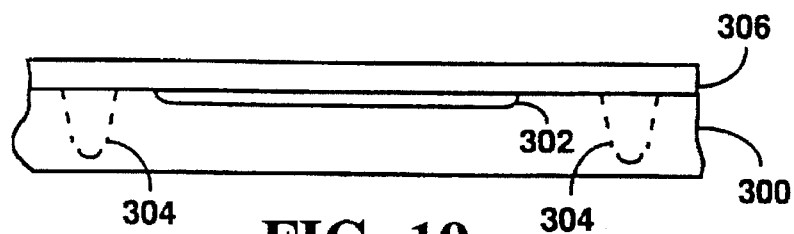
FIGS. 19, 20, 21a and 21b are cross-sectional views illustrating the steps of producing a heterojunction bipolar transistor according to another embodiment of the invention.

FIG. 19 shows a schematic cross-sectional view of a semiconductor substrate 300 with a selected (100) crystalline orientation of a p⁻ conductivity type Si. The surface of substrate 300 is initially prepared by implanting a sub-collector n⁺ region 302 into the top surface, followed by the diffusion or etching of isolation regions 304. This also could have been done as described with respect to FIGS. 2, 3, and 16 above. A thick field oxide layer 306 of SiO₂ is then grown on the surface of substrate 300.

Figure 20:
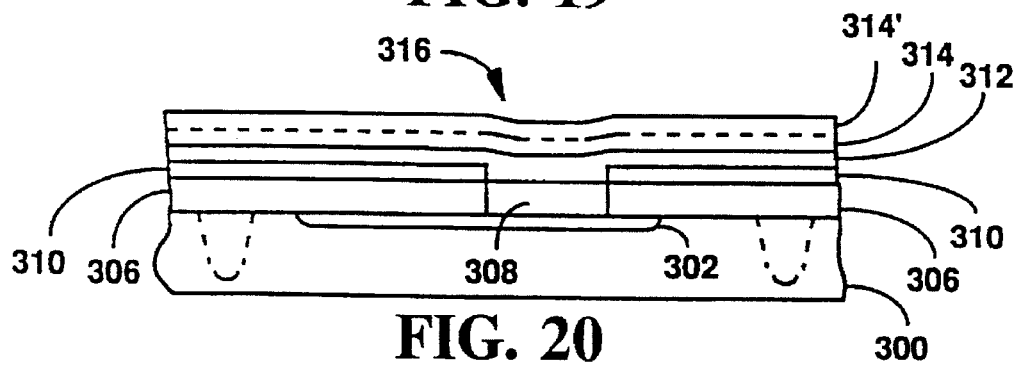

Next, in FIG. 20 a window is opened in the field oxide layer 306 to form the active region 316 of the transistor above one end of the sub-collector region 302. Then a Si collector layer 308 is grown by selective epitaxy in the active region window. A polycrystalline Si layer 310 is next formed on the field oxide layer 306 (removed from 308) leaving the top surface of layer 308 free. This poly Si layer can be made p⁺ type. Next, a p⁺ SiGe layer 312 is grown nonselectively so that it is epitaxial over the exposed epitaxial Si layer 308 and polycrystalline over the polycrystalline Si layer 310 that is above the field oxide layer 306. That is followed by the growth of one or two layers 314 and 314' of n type Si over SiGe layer 312.

Alternatively, poly Si layer 310 can be self aligned with collector layer 308 by processing the partially processed wafer of FIG. 19 in a different sequence of events which will produce a further processed substrate that looked the same as that produced by the above-listed steps and shown in FIG. 20. On top of the field oxide layer 306 the poly Si layer 310 is deposited, and then a dielectric layer is placed on top of poly Si layer 310. That dielectric layer can be either deposited or thermally grown. Next, lithography is used to define active region 316 by etching through the top dielectric layer, poly Si layer 310 and the underlying field oxide layer 306, down to the subcollector layer 302. Then dielectric sidewalls 307 are formed in well 316. Then the Si collector layer 308 is selectively grown in the active region 316 as shown in FIG. 21b. After the collector layer 308 is formed, the wafer is removed from the reactor, the top dielectric layer that is on the poly Si layer 310 is removed. The substrate is then re-inserted into the reactor for deposition of the SiGe layer 3 12, and the Si layers 314 and 314' over the entire substrate as discussed above. Either process then continues below with the discussion of FIGS. 21a and 21b.

Figure 21A:
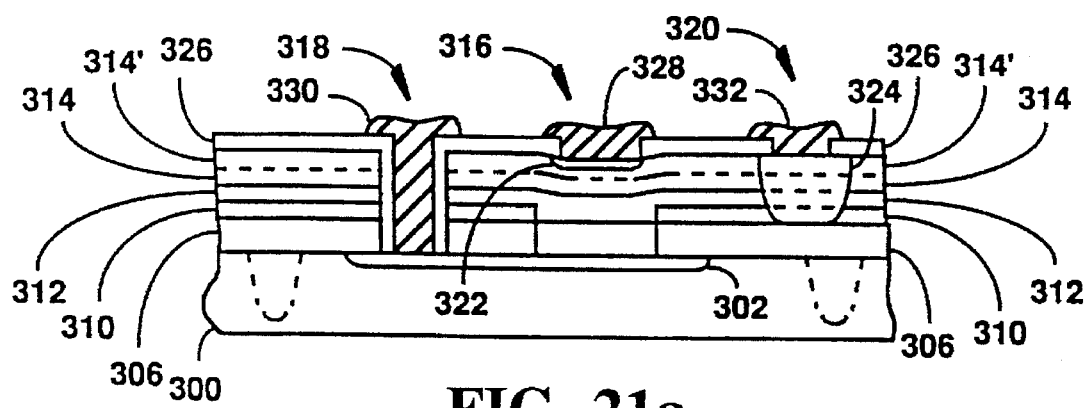
Figure 21B:
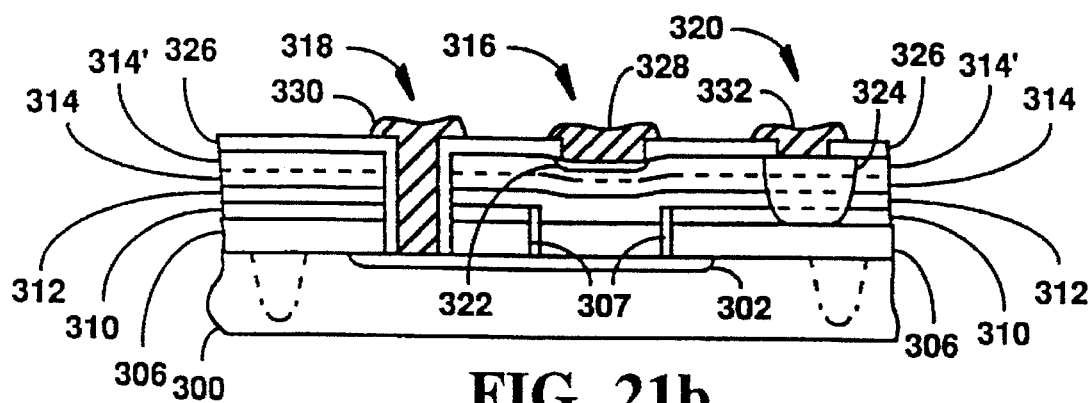

FIGS. 21a and 21b then show the finalization of the transistor of this embodiment which also is nearly identical to that illustrated in FIG. 14. First, the silicon layers 314 and 314' can be made p⁺ type outside the active region 316, then an oxide layer 326 is grown on the surface of substrate 300 and windows opened where the base, emitter and collector contacts are to be located. Layer 314 or 314' is doped n⁺ through the window in the active region 316 to form layer 322, the base contact region is doped p⁺ to from base contact 324, and the collector contact 330 is formed through all of the layers to the sub-collector region 302. Finally, base, emitter and collector terminals 332, 328 and 330, respectively, are metallized in the appropriate locations. As in the previously discussed embodiments, the collector and base contacts can be developed by other techniques.

For this configuration, since the base lead is already heavily doped p⁺ type Si, the contact region can be separated from the device emitter region without introducing large series base resistance. Therefore, a self-aligned process for the emitter and extrinsic base is not needed.

Figure 22:
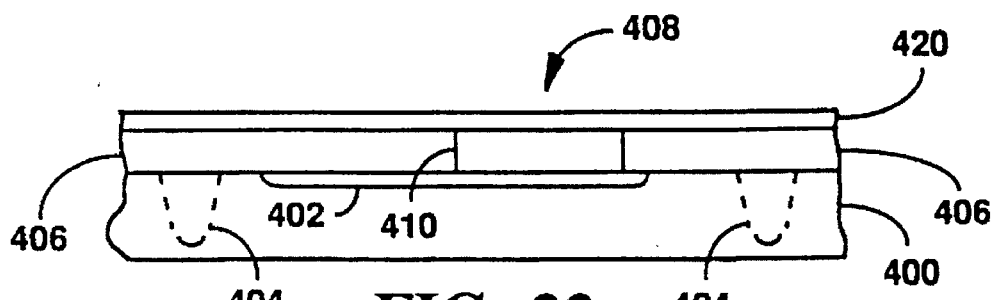
FIGS. 22–25 are cross-sectional views illustrating the steps of producing a heterojunction bipolar transistor according to another embodiment of the invention.

Steps for producing another embodiment of the invention are discussed below in relation to FIGS. 22–25 where the results of the various process steps are illustrated schematically. In FIG. 22 the p⁻ Si substrate 404 is prepared in any of several different ways to form an n⁺ Si subcollector layer 402 and isolation regions 404. A SiO₂ layer 406 is then grown on the top surface of substrate 400 and a window opened through it in the active region 408. An n type Si layer 410 is then grown selectively epitaxially in window 408, followed by the deposition of a p⁺ polycrystalline Si layer 420 over the entire surface of the substrate.

Figure 23:
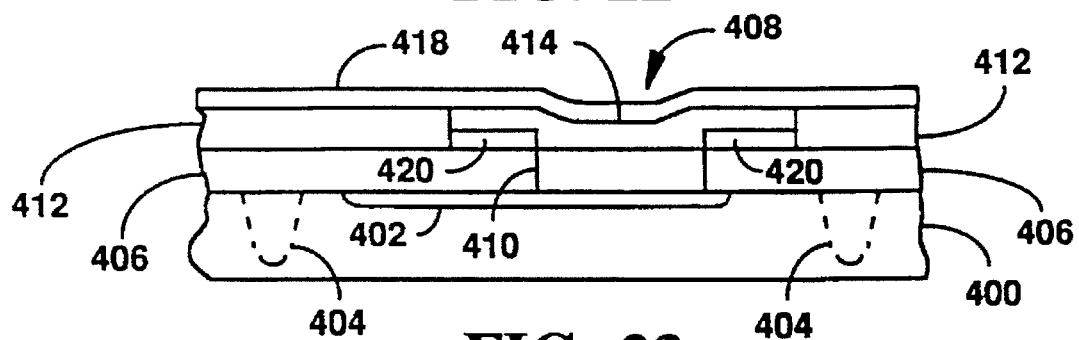

Then in FIG. 23 the next step is the removal of the poly Si layer 420 both above layer 410 and over the outer reaches of dielectric layer 406 to form a ring of poly Si around layer 410. Oxide layer 412 is then deposited over the entire surface of the substrate, and a window through it is opened above both the Si layer 410 and the poly Si layer 420. Over both layers 410 and 420 a p⁺ type SiGe layer 414 is deposited with the portion of this layer above layer 410 being single crystalline and the portion above layer 420 being polycrystalline. That is then followed by the deposition of a $SiO_2$ layer 418 over the entire surface of the substrate.

Figure 24:
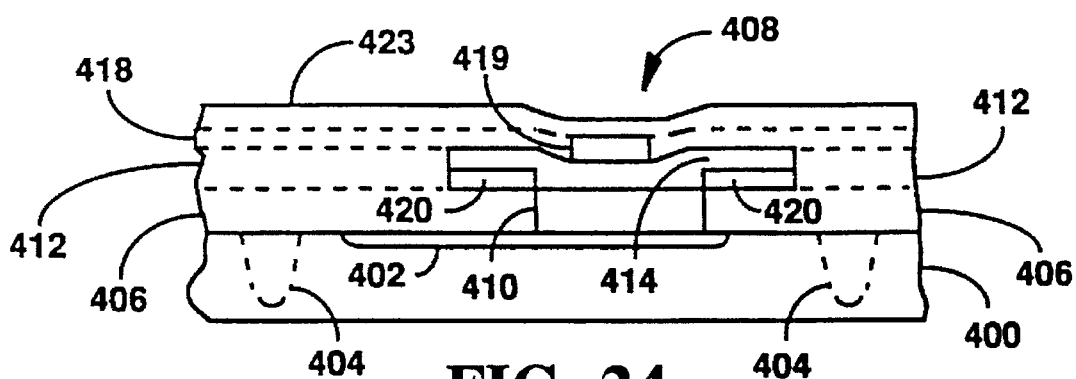

In FIG. 24 the process continues with the opening of a window in dielectric layer 418 that is less than the full width of layer 410 in region 408. An a type Si layer 419 is deposited that is single crystalline. Next, another $SiO_2$ layer 423 is formed over the entire surface of the substrate.

Figure 25:
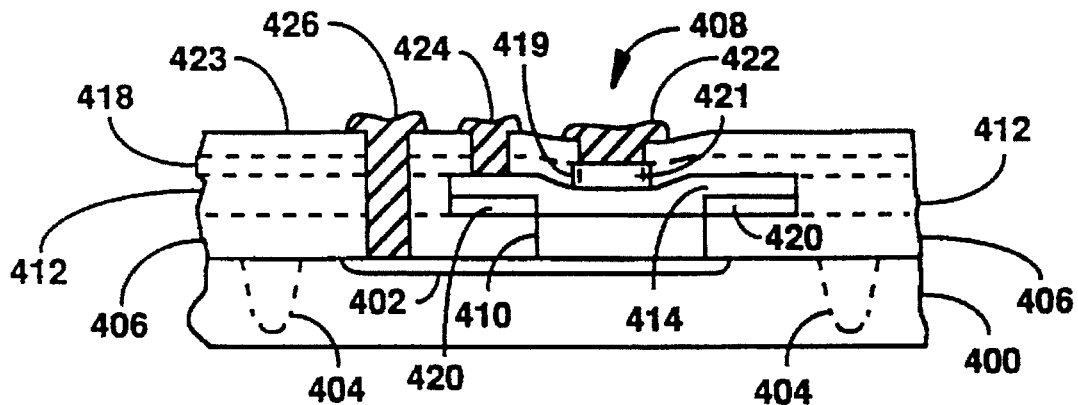
Figure 26:
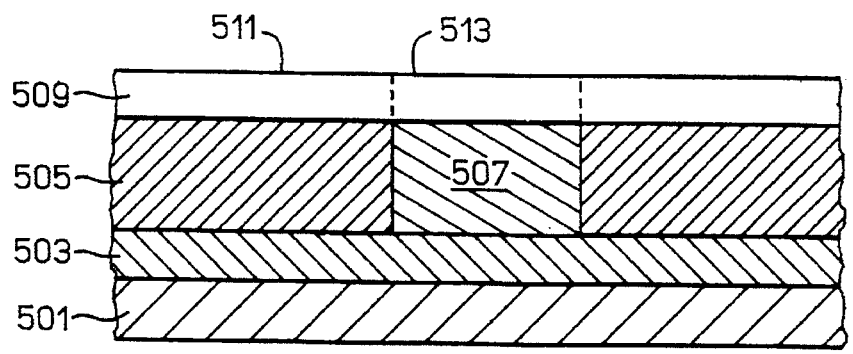
FIGS. 26–31 are cross-sectional views illustrating the steps of producing a heterojunction bipolar transistor according to another embodiment of the invention.
Figure 27:
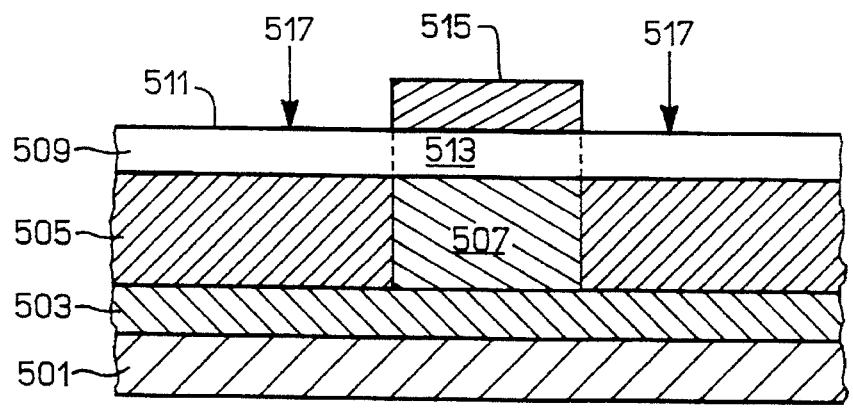
Figure 28:
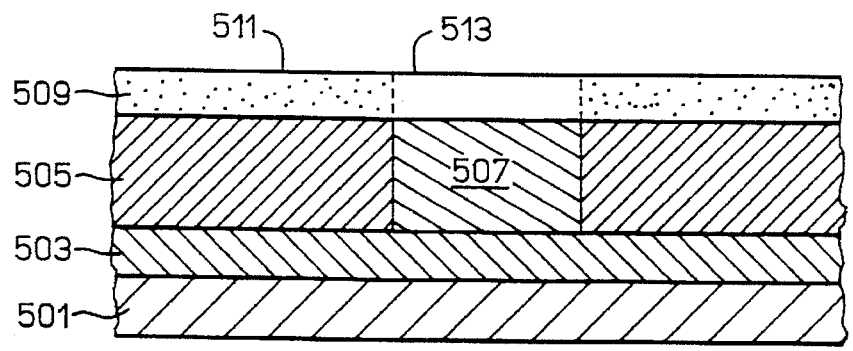
Figure 29:
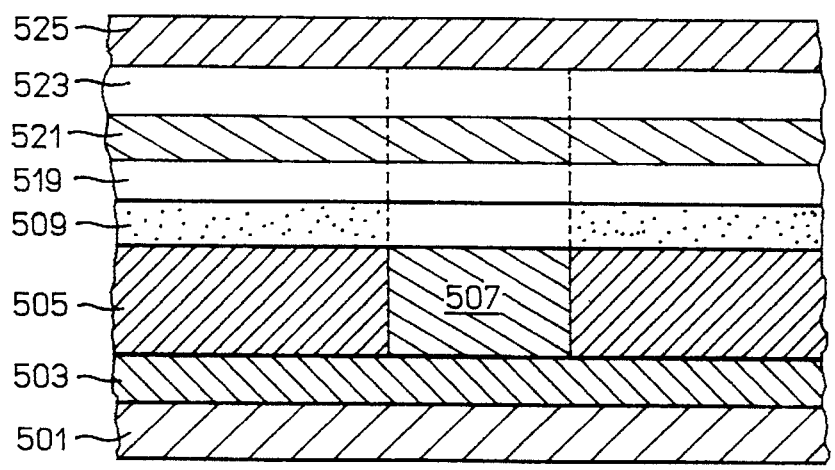
Figure 30:
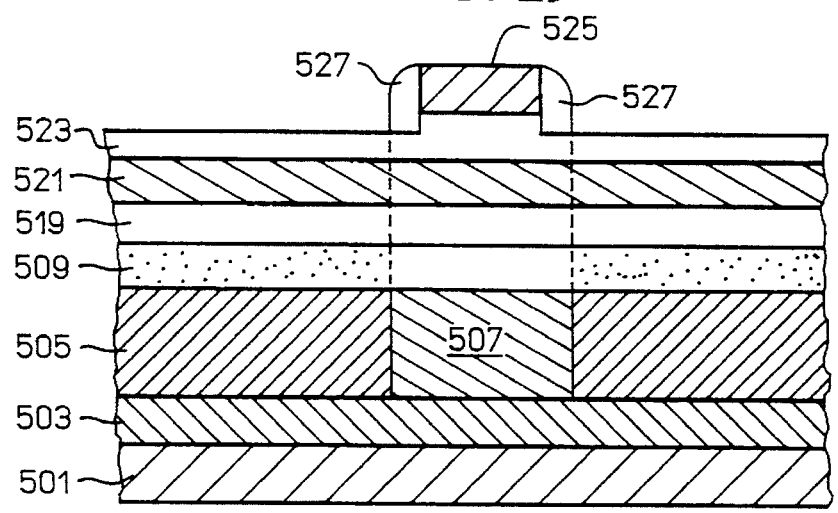
Figure 31:
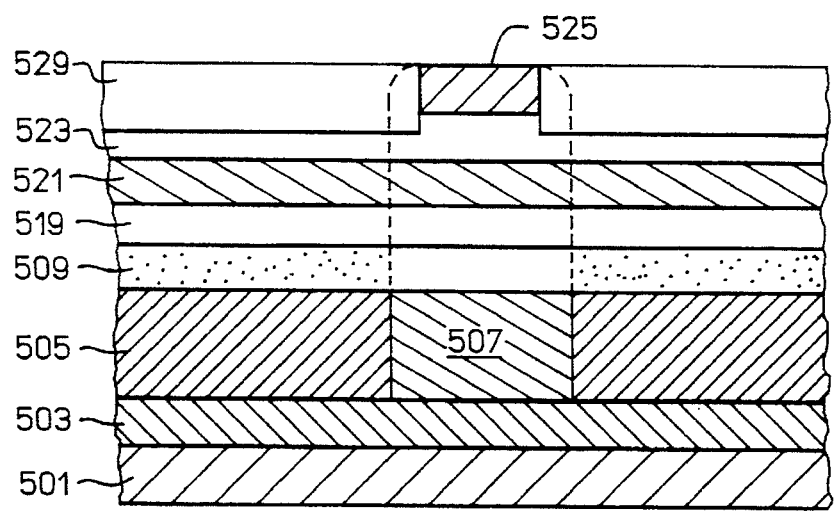

Finally, as shown in FIG. 25, windows are opened through the $SiO_2$ layers for form the metallizations for the emitter, base and collector contacts 422, 424 and 426, respectively. In each case the window extends only through oxide to the first non-oxide layer. The emitter contact window extends to layer 419, with at least the top portion of layer 419 being heavily doped with arsenic or phosphorus to promote good electrical contact. The base window extends to layer 414, and the collector window extends to the sub-collector layer 402. The final step is then the metallization of the emitter, base and collector contacts as identified as 422, 424, and 426, respectively.

Another embodiment is shown in FIGS. 26–31. A semiconductor device according to this embodiment is fabricated on a substrate 501. A subcollector region 503 is formed on the substrate 501 as has been described above. A field oxide layer 505 is formed over the subcollector region 503 and a window is opened therethrough to the subcollector region, the window defining an active region.

Next, a silicon layer 507 is deposited in the window. A silicon collector layer 509 is deposited by mixed deposition over the field oxide layer 505 and into the window and contacts the silicon layer 507 in the window. The collector layer 509 is characterized by an integral polycrystalline and epitaxial structure, 511 and 513, respectively, the structure being polycrystalline over the field oxide layer and epitaxial over the silicon layer in the window. The epitaxial portion is preferably about 200 nm thick. The polycrystalline portion may be of slightly different thickness.

A resist mask 515 is then placed over the window, and the surrounding polycrystalline portion 511 of the layer 509 is doped p-type by ion implantation. The resist 515 may be made approximately the same size as the window. Slight misalignment may prevent a small region of the polycrystalline silicon from being implanted directly, but lateral straggle during the implantation, and lateral diffusion during the subsequent annealing cycle will cause the entire polycrystalline region to become heavily doped p-type. A thin thermal oxide may be formed during the annealing cycle, or the surface may be covered with a deposited oxide before the annealing cycle, to minimize gas-phase dopant transport from the heavily doped regions to the lightly doped, single-crystal region.

Further epitaxial layers are then deposited. These deposited layers consist of an optional thin layer 519 of silicon, followed by a base layer 521 of $Si_{1-x}Ge_x$, and a top layer 523 of silicon. The silicon-germanium base layer 521 extends over the silicon collector layer 509, the silicon-germanium layer characterized by an integral polycrystalline and epitaxial structure that is polycrystalline over the polycrystalline part 511 of the collector layer and epitaxial over the epitaxial part 513 of the collector layer.

The silicon layers are moderately doped n-type. The major portion of the thickness of the $Si_{1-x}Ge_x$ is doped p-type during the deposition and serves as the base region, and the top Si layer is moderately doped n-type and serves as the emitter of the transistor. A typical thickness of the $Si_{1-x}Ge_x$ layer might be about 50 nm, and the layer may have a Ge content of about 20 percent. The top silicon layer might be about 150 nm thick; doping in this emitter would be much lower than in a conventional bipolar transistor to reduce emitter-base capacitance and noise.

A heavily doped, n-type, polycrystalline-silicon layer 525 is placed over the deposited layers described above, with the doping preferably added during the deposition. This layer could be deposited in a different reactor than used for the mixed epitaxial/polycrystalline layers.

Next, the layer 525 is covered with photoresist and etched. The resist-covered region can have the minimal dimensions allowed by the photolithography system available, and is one alignment tolerance smaller than the previously defined epitaxial region of the mixed deposition. The photoresist is used as a mask for etching the heavily doped polysilicon layer 525, with the etch stopping in the top silicon layer 523 of the mixed deposition. A sidewall spacer 527 is then added by conventional techniques, and shallow p-type doping is added by ion implantation. A mild rapid thermal anneal at a temperature of approximately 800–850 degrees C., activates the implanted dopant and also lowers the resistance between the n-type polysilicon 525 and the underlying single-crystal emitter region 523.

If desired, the exposed surface of the implanted p-type layer, and possibly the n-type polysilicon, can be covered with a silicide layer (not shown) to further lower the extrinsic base resistance.

Oxide 529 is then deposited over the structure, and the surface can be made planar by a conventional resist-and-etchback process or other known techniques. The emitter surface can be exposed by the etchback process, contact openings can be etched through the oxide to the extrinsic base regions. Metallization then completes the device fabrication.

Figure 32:
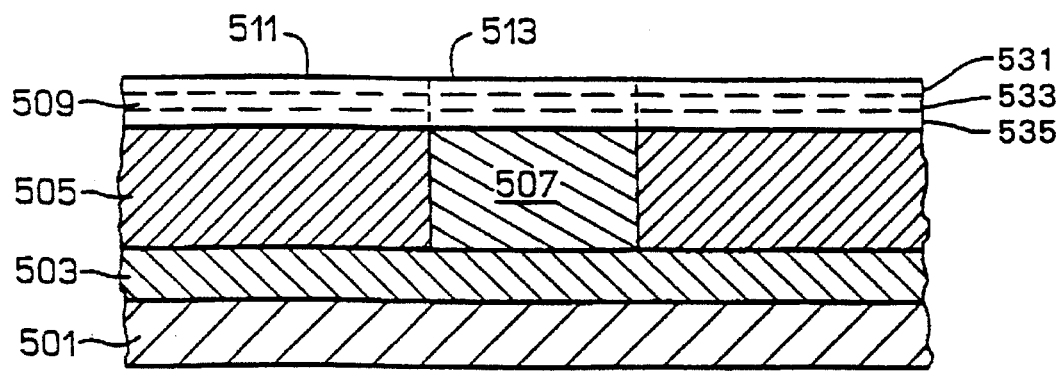
FIG. 32 is a cross-sectional view of a variant of the embodiment shown in FIGS. 26–31.

An alternative structure can be fabricated by the following slightly-modified process, as shown in FIG. 32. After the oxide isolation structure 505 is formed, a mixed epitaxial/polycrystalline collector layer 509 is then grown such that the layer 509 has an epitaxial portion 513 over the silicon layer 507 and a polycrystalline portion 511 over the oxide, as described above. However, in this alternative structure, the deposited material 509 consists of a multilayer structure containing a top layer 531 of silicon, a middle layer 533 of $Si_{1-x}Ge_x$ and a bottom layer 535 of silicon. The bottom silicon layer 535 preferably has a thickness in the range of 50–200 nm. The silicon layers 531 and 535 are moderately doped n-type. The remainder of the structure is as described above, as are the requirements for the heavily doped n-type polycrystalline region 525 deposited over the mixed layers.

The n-type polysilicon layer 525 is etched using a resist layer as described in the primary structure described previously. After the sidewall spacer 527 is formed, a boron implant is used to dope the exposed extrinsic base polycrystalline regions heavily conducting p type. However, in this structure, a multiple step implant would be used to convert the entire thickness of the polycrystalline region to highly conducting p-type material. The device processing could then continue as previously described.

The above-discussed processes for the production of a transistor according to the various disclosed embodiments are by no means limited to the order in which the steps were discussed, and one skilled in the semiconductor art would be knowledgeable in the reordering of the various steps to produce high-speed transistors and other semiconductor components. For example, a diode can be produced by any of the above-outlined processes by merely omitting the emitter regions which are finalized after the deposition of the SiGe layer.

Although the silicon layer below the SiGe layer has been called the collector and the silicon layer above the SiGe has been called the emitter, the nearly symmetrical structure of the transistor would allow the lower silicon layer to be used as an emitter and the upper silicon layer to be used as a collector if desired.

In most of the above-described embodiments, no mention has been made as to the actual thicknesses of any of the layers. While layer thickness is important to the operation of the finished device, those thicknesses are well known from the prior art, and particularly from the references cited in the background section above. In those instances where particular dimensions have been given, the dimensions are intended to be exemplary.

In a transistor that embodies the principles of the invention, the base connection is separated from the underlying collector region by a layer of $SiO_2$ which has low relative permittivity. The collector-base junction area is approximately the same as the emitter-base junction area. This decreases the base-collector capacitance by approximately 70% (for an oxide thickness of 500 nm), significantly increasing the maximum frequency at which the transistor can operate.

The ability to deposit SiGe selectively using dichlorosilane ($SiH_2Cl_2$) gas has been investigated in fabricating devices according to the invention. An oxide mask is used to define the regions on which deposition occurs. A silicon collector layer is grown, followed by in-situ deposition of the SiGe layer. For non-selective deposition a gas other than dichlorosilane, for example germane ($GeH_4$) or other gases that contain Si and Ge, should be used.

Prior to the establishment of the SiGe layer the temperatures that are used are those typically used in the processing of Si semiconductor devices, typically around 1000° Celsius. The SiGe layer is established at typically 625° C. and the post SiGe processing of the semiconductor device is done at as low a temperature as practical, typically in the range of 800° to 850° C. The percentage of Ge in the alloy layer is dictated largely by the application of the device, and is generally in the range of 10–30% by atomic fraction.

From the foregoing it will be appreciated that a heterojunction bipolar transistor according to the invention has a significantly improved high frequency response which results from avoiding tradeoffs between base resistance and emitter injection efficiency. Parasitic elements, especially extrinsic base-collector capacitance, are greatly reduced. The limited heat cycle inherent in the abrupt $Si_{1-x}Ge_x/Si$ heterojunction transistor also allows this device to be placed on a nearly completed integrated circuit containing other elements, such as MOS transistors, with minimal changes in the characteristics of these elements.

Although certain specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

We claim:

1. A method for producing a low capacitance, high speed, heterojunction transistor, the method comprising the steps of:

a. initially processing a p type Si substrate having a surface, including:
      (1) creating a n type collector region on said surface by forming an $n^+$ Si layer on said surface and depositing an $n^-$ Si layer over said $n^+$ Si layer;
      (2) growing a field oxide layer over said top surface and said collector region, depositing a first $p^+$-type polycrystalline Si layer over said field oxide layer, growing a $SiO_2$ layer over said first $p^+$ type polycrystalline Si layer, wherein a window is defined through each of said field oxide, said first $p^+$ type polycrystalline Si and said $SiO_2$ layers to expose an active region of the transistor over a portion of said collector region;

b. non-selectively depositing a p type SiGe layer over said field oxide layer and into said window;

c. non-selectively depositing an n type Si layer over said p type SiGe layer;

d. depositing a dielectric layer over said n type Si layer;

e. opening at least first, second, and third contact windows through said dielectric layer, said first window defining an emitter contact window exposing said n type Si layer said second window defining a base contact exposing said p type SiGe layer, and said third contact window exposing said collector region; and f. metalizing contacts in said first, second and third windows;

g. non-selectively depositing a second p type polycrystalline Si layer over said $SiO_2$ layer and into said active region prior to commencing step b; and h. removing said second polycrystalline Si layer of step g. from a bottom part of said window in said active region, and said second polycrystalline Si layer of step g. and said $SiO_2$ layer from a region overlying said first $p^+$-type polycrystalline Si layer, prior to commencing step b.

2. A method as in claim 1 further including, following step h. and preceding step b., the step of:

i. doping an intersection part of said second polycrystalline Si layer and said n– type collector region to extend type p material partially into a surface of said n type collector region.

3. A method as in claim 2 wherein step d. includes the steps of:

j. forming a first dielectric material on vertical sides of said n type Si layer in said window; and k. forming a second dielectric material over said substrate surface and into said window.

4. A method for producing a low capacitance, high speed, heterojunction semiconductor device, the method comprising the steps of:

a. initially processing a p-type Si substrate having a top surface, including:
      (1) creating a subcollector region on said top surface;
      (2) growing a field oxide layer over said top surface of said substrate and over said subcollector region, said field oxide layer defining a window therethrough to expose an active region of said semiconductor device;

b. depositing a first silicon layer in said window;

c. depositing a second silicon layer over said field oxide layer and over said first silicon layer to form an integral collector structure, wherein the part of said integral collector structure that overlies said field oxide layer has a polycrystalline structure and wherein the part of said integral collector structure that overlies said first silicon layer has an epitaxial structure;

d. depositing an integral base layer of SiGe on top of said integral collector structure wherein the part of said integral base layer that overlies said polycrystalline part of said integral collector structure has a polycrystalline structure and wherein the part of said integral base layer that overlies said epitaxial part of said integral collector structure has an epitaxial structure;

e. depositing third silicon layer over said SiGe base layer, wherein the part of said third silicon layer that overlies said epitaxial part of said SiGe base layer has an epitaxial structure, and any part of said third silicon layer that overlies said polycrystalline part of said SiGe base layer has a polycrystalline structure; and f. placing a heavily doped, n-type, polycrystalline-silicon emitter layer over said deposited integral base and third silicon layers.

5. The method of claim 4, further comprising the step of:

p-type doping the portion of said integral collector structure having a polycrystalline structure.

6. The method of claim 4, further comprising the steps of:

g. etching said heavily doped, n-type, polycrystalline-silicon emitter layer to reach at least said deposited epitaxial silicon layer;

h. adding a sidewall spacer having a shallow p-type doping;

i. depositing an oxide layer over said substrate;

j. exposing said emitter layer;

k. etching openings through said oxide layer; and m. forming electrical contacts within said openings.

7. The method of claim 4, further comprising the step of:

depositing a thin layer of epitaxial silicon over said collector structure.

8. The method of claim 4, further comprising the step of:

covering said substrate surface with a silicide layer.

9. A method for producing a low capacitance, high speed, heterojunction semiconductor device, the method comprising the steps of:

a. initially processing a p-type Si substrate having a surface, including:

(1) creating a subcollector region on said substrate surface;

(2) growing a field oxide layer over said surface and over said subcollector region and defining a window therethrough to expose an active region of said semiconductor device;

b. depositing a first silicon layer in said window; and c. growing a multilayer, epitaxial/polycrystalline structure on said surface, said epitaxial/polycrystalline structure comprising a top layer of silicon, a middle layer of $Si_{1-x}Ge_x$, and a bottom layer of silicon, wherein said part of said epitaxial/polycrystalline structure overlying said oxide layer has a polycrystalline structure and wherein said part of said epitaxial/polycrystalline structure overlying said silicon layer has an epitaxial structure; and d. placing a heavily doped, n-type, polycrystalline-silicon emitter layer over the deposited base and epitaxial silicon layers;

wherein said top and bottom silicon layers are n-type doped.

10. The method of claim 9 further comprising the steps of:

e. etching said heavily doped, n-type, polycrystalline-silicon emitter layer to reach at least said deposited epitaxial silicon layer;

f. adding a sidewall spacer having a shallow p-type doping;

g. doping a part of said epitaxial/polycrystalline layer having a polycrystalline structure with a boron implant;

j. depositing an oxide layer over said substrate;

k. exposing said emitter layer;

m. etching openings through said oxide layer; and n. forming electrical contacts within said openings.

11. The method of claim 9, further comprising the step of:

forming a thin layer of silicon over said epitaxial/polycrystalline structure, wherein said thin layer is epitaxial over an epitaxial portion of said structure and wherein said thin layer is polycrystalline over a polycrystalline portion of said structure.

12. The method of claim 9, further comprising the step of:

covering the surface of said substrate with a silicide layer.

* * * * *